(12) United States Patent
Pain

(10) Patent No.: US 7,468,501 B2
(45) Date of Patent: Dec. 23, 2008

(54) LINEAR DYNAMIC RANGE ENHANCEMENT IN A CMOS IMAGER

(75) Inventor: Bedabrata Pain, Los Angeles, CA (US)

(73) Assignee: California Institute of Technology, Pasadena, CA (US)

( * ) Notice: Subject to any disclaimer, the term of this patent is extended or adjusted under 35 U.S.C. 154(b) by 164 days.

(21) Appl. No.: 11/433,793

(22) Filed: May 12, 2006

(65) Prior Publication Data
US 2007/0007434 A1 Jan. 11, 2007

Related U.S. Application Data

(60) Provisional application No. 60/680,434, filed on May 12, 2005.

(51) Int. Cl.
H01L 27/00 (2006.01)
(52) U.S. Cl. .................... 250/208.1; 348/308
(58) Field of Classification Search ........... 250/208.1, 250/214 R; 257/290–292, 440; 348/308
See application file for complete search history.

(56) References Cited

U.S. PATENT DOCUMENTS

| 5,281,805 | A | 1/1994 | Sauer ............... 250/214 R |
| 6,707,410 | B1* | 3/2004 | Bock ............... 341/155 |
| 6,933,488 | B2 | 8/2005 | Pain ............... 250/214.1 |
| 6,944,352 | B1 | 9/2005 | Yadid-Pecht et al. ... 382/262 |
| 2004/0169740 | A1 | 9/2004 | Pain et al. ........ 348/229.1 |
| 2005/0051701 | A1 | 3/2005 | Hong ............... 250/214.1 |
| 2005/0092894 | A1 | 5/2005 | Fossum ............ 250/208.1 |
| 2006/0068586 | A1 | 3/2006 | Pain | |

FOREIGN PATENT DOCUMENTS

WO 2006/015113 A1 2/2006

* cited by examiner

Primary Examiner—Georgia Y Epps
Assistant Examiner—Kevin Wyatt
(74) Attorney, Agent, or Firm—Steinfl & Bruno

(57) ABSTRACT

A CMOS imager with increased linear dynamic range but without degradation in noise, responsivity, linearity, fixed-pattern noise, or photometric calibration comprises a linear calibrated dual gain pixel in which the gain is reduced after a pre-defined threshold level by switching in an additional capacitance. The pixel may include a novel on-pixel latch circuit that is used to switch in the additional capacitance.

28 Claims, 4 Drawing Sheets

LINEAR DYNAMIC RANGE ENHANCEMENT IN A CMOS IMAGER

CROSS REFERENCE TO RELATED APPLICATION

This application claims the benefit of U.S. provisional patent application Ser. No. 60/680,434, filed May. 12, 2005 for a "Linear Dynamic Range Enhancement in a CMOS Imager" by Bedabrata Pain, the disclosure of which is incorporated herein by reference for all purposes permitted by law and regulation.

STATEMENT REGARDING FEDERALLY SPONSORED RESEARCH OR DEVELOPMENT

Subject matter disclosed in this specification was supported at least in part through the performance of work under a NASA grant, and is subject to the provisions of Public Law 96-517 (35 U.S.C. § 202) in which the Contractor has chosen to retain title.

FIELD

The present disclosure relates to image sensors, in particular, it relates to an imager circuit, a pixel, and processes and methods to achieve a high dynamic range.

BACKGROUND

Dynamic range (DR) is defined as the ratio of the saturation photon flux ($\Phi_{max}$) to the minimum detectable photon flux ($\Phi_{min}$, in which the signal to noise ratio (SNR)=1). Therefore, the dynamic range of an image sensor is given by:

$$DR = \frac{\Phi_{max}}{\Phi_{min}} = \frac{V_{max}}{V_{noise}} \cdot \frac{\eta(\Phi_{min})}{\eta(\Phi_{max})} \cdot \frac{g_{c_{max}}}{g_{c_{min}}} \cdot \frac{T_{int_{max}}}{T_{int_{min}}} \cdot \frac{A_{v_{max}}}{A_{v_{min}}} \quad (1)$$

$$V_{noise} = \sqrt{V_{down}^2 + V_{pix}^2 + \eta \Phi_{max} \cdot \Phi_{min} \cdot T_{int_{max}} \cdot g_{c_{max}}^2 \cdot A_{v_{max}}^2}$$

in which $V_{max}$ is the maximum signal strength of the pixel in volts, $V_{noise}$ is the signal strength of the noise in volts, $\eta$ is the quantum efficiency at a given photon flux, $g_c$ is the effective converion gain, $T_{int}$ is the integration time, $A_V$ is the signal chain gain, $V_{down}^2$=noise power of the signal chain, and $v_{pix}^2$=noise power of the pixel circuits.

It can be seen from equation (1) that there are several different ways of improving the dynamic range of an image sensor. However, each method has its limitations.

A common technique of increasing dynamic range involves changing $T_{int}$ based on illumination level. However, this method causes severe motion-related imaging artifacts.

Increasing the gain of the signal change $A_V$ can be used to increase dynamic range only if the imager system is limited by the resolution of the analog to digital converter (ADC). It does not provide any intrinsic dynamic range increase because it does not increase the number of photons captured, nor reduce the noise levels.

Increasing $V_{max}$ or increasing the reset voltage of a photodiode in order to increase the dynamic range of a photodiode in a pixel is another means for improving the dynamic range of an image sensor. A technique of this sort is taught by international application PCT/US2005/026772, published as WO 2006/015113 A1, for which the present inventor is an applicant and inventor and the disclosure of which is incorporated by reference into this specification for all purposes permitted by law and regulation. However desirable a larger $V_{max}$ or reset voltage may be, state-of-the-art CMOS fabrication processes do not allow $V_{max}$ to be increased due to a steady reduction in the maximum usable power supply voltage. Accordingly, this technique has limitations on when it may be used.

Another method of increasing the dynamic range is to reduce the conversion gain. However, in such cases, low-light-level sensitivity is compromised. The output voltage swing of the image sensor is usually fixed and relatively small due to the power supply scaling. Obtaining a high dynamic range therefore generally requires a small conversion gain so that the input pixel electron accumulation capacity is increased. On the other hand, a small conversion gain increases the reset noise, with reset noise $N_e$ (in electrons) being given by:

$$N_e = \sqrt{\frac{\phi_T}{g_c}} \quad (2)$$

where $g_c$ is the effective conversion gain, and $\Phi_T(=kT/q)$ is the thermal voltage. Thus, an image sensor (imager) designed with a small conversion gain provides a large signal handling capacity but poor noise, while that with a large conversion gain provides better low-light imaging capability but with a reduced dynamic range.

For a fixed $V_{max}$, the best and the most difficult way of improving the dynamic range without introducing imaging artifacts or increasing the imager noise floor is to change the conversion gain ($g_c$) based on the illumination level. Moreover, the variation in conversion gain must not affect the linearity or calibration capability of the image sensor.

Variation of the conversion gain based on illumination level can solve the problem, but introduces a large number of other problems such as loss of photometric calibration (because of uncertainties of the transition point), fixed patter noise, and non-linearity. Thus, in spite of being the most attractive approach to dynamic range enhancement, variation of the conversion gain has not been practically realized for linear image sensors.

SUMMARY

A solution to the problem of linear dynamic range enhancement is provided in the form of circuits and methods that permit dual gain imaging. The novel circuit according to the invention allows an accurate determination of the transition point (from high gain to low gain), and provides a linear high dynamic range output without any loss of linearity, calibration or introducing any noise.

In an aspect of the circuits and methods disclosed herein, a linear calibrated dual gain pixel for an imager is provided having a first gain during an integration period when a voltage corresponding to an accumulation is above a predetermined level, and a second and lower gain during the integration period when the voltage corresponding to the accumulation decreases below the predetermined level.

In a further aspect of the circuits and methods disclosed herein, an imager circuit having increased dynamic range is provided that comprises a plurality of pixels, each pixel comprising a photodiode associated with a floating diffusion; at least one capacitor; and a device for selectively coupling the at least one capacitor to the floating diffusion so as to increase capacitance available to the pixel and thereby decrease the gain of the pixel.

In yet a further aspect of the circuits and methods disclosed herein, a linear calibrated dual gain pixel is provided comprising a photodiode associated with a floating diffusion operatively coupled to a circuit, the pixel having a first gain, means for providing the pixel with a second gain lower than the first gain by adding an additional capacitance to the floating diffusion after a pre-defined threshold level of accumulation in the pixel, and means for correcting for offset errors.

In another aspect of the circuits and methods disclosed herein, a multi-step process for achieving high dynamic range in a pixel comprising a photodiode associated with a floating diffusion during an integration period is provided, the process comprising a first stage which starts after the pixel has been reset and during which the pixel is being exposed to light and is accumulating; a second stage which occurs after an accumulation level of the pixel reaches a preset value during the integration period in which additional capacitance is coupled to the floating diffusion in order to decrease the gain of the pixel while the pixel continues to accumulate.

In still a further aspect of the circuits and methods disclosed herein, a method of increasing dynamic range of a pixel disposed in an array of pixels is provided, the method comprising arranging a photodiode associated with a floating diffusion in the pixel with at least three transistors in the pixel for controlling resetting of the photodiode, sensing by the photodiode, and readout of a voltage stored on the photodiode after sensing, respectively; providing a capacitor coupled by a fourth transistor to the floating diffusion; selectively turning on the fourth transistor in order to increase the capacitance available to the floating diffusion when the accumulation has reached a preset value.

BRIEF DESCRIPTION OF DRAWINGS

The present invention will be understood and appreciated more fully from the following detailed description taken in conjunction with the drawings in which.

DETAILED DESCRIPTION OF PREFERRED EMBODIMENTS

The circuits and methods disclosed herein will now be described more fully hereinafter with reference to the accompanying drawings, in which preferred embodiments of the circuits and methods disclosed herein are shown. The circuits and methods disclosed herein may be embodied in many different forms and should not be construed as being limited to the embodiments set forth herein.

Figure 1:
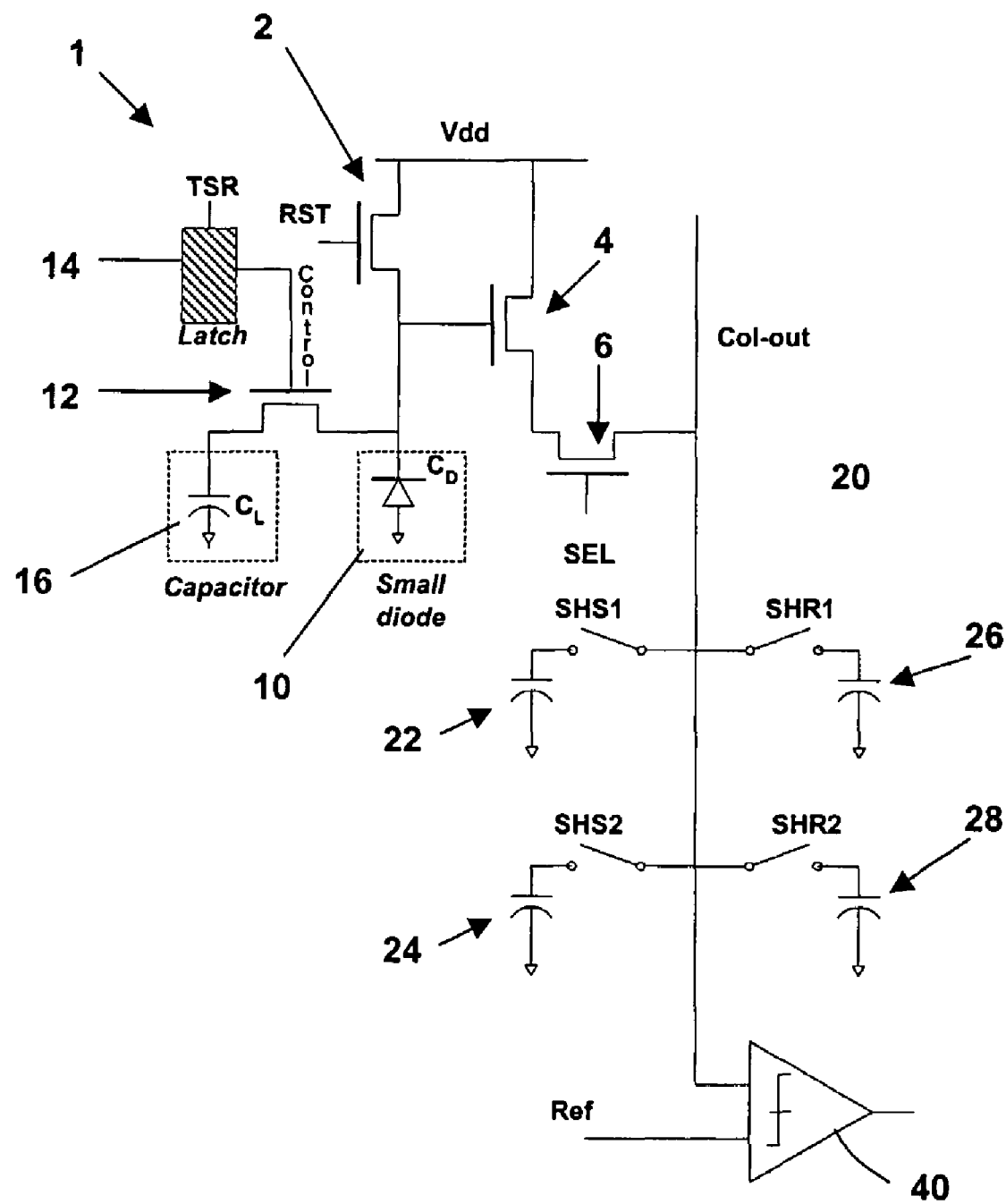
FIG. 1 shows a schematic of a high-dynamic range pixel circuit.

FIG. 1 shows the schematic of a currently preferred embodiment of a pixel 1 of a CMOS imager.

CMOS imagers are electronic camera or imaging chips implemented in CMOS (complementary metal/oxide/silicon) technology, the technology presently used to make a large fraction of analog electronic circuits, as well as virtually all digital electronics. The CMOS process uses n-channel and p-channel field-effect transistors, as well as, typically, diodes, resistors and capacitors. A CMOS imager contains a light-sensitive area or photo-sensing element where an optical image is focused. The image is converted into an electrical signal at the light-sensitive area. The CMOS imager also typically includes surrounding support electronics that read-out the electrical signal, producing an analog or digital video output signal.

The light sensitive area is divided into a two-dimensional array of picture elements, or pixels. Each pixel in the array converts the light that falls on that pixel over an integration time period into a single signal voltage that can be read out by the support electronics.

Of course, those skilled in the art recognize that an imager may well have millions of pixels 1 in a given imager arranged in a two dimensional array of pixels and that only a single pixel 1 is represented by FIG. 1. The pixels 1 become sensitive to light impinging them during an integration time period when electrons are bled off a capacitor or capacitative element inherently associated with a photosensitive diode 10.

The pixel 1 shown in FIG. 1 comprises a conventional photodiode 10 and transistors 2, 4, and 6. The reset transistor 2 controls the resetting of the photodiode 10. The source to follower transistor 4 has the gate electrode connected to the photodiode 10 and controls sensing by the photodiode 10. The select transistor 6 is connected in series with the source to follower transistor 4 and controls reading out of the voltage stored on the photodiode 10. The level of the voltage stored on the photodiode 10 is linearly related to the accumulation of the photodiode 10. The level of the voltage stored on the photodiode 10 will be less the longer the photodiode 10 is exposed to light, assuming no change in gain, because the accumulation causes electrons to be integrated on a capacitor ($C_D$) inherently associated with the photosensitive diode 10 and reducing the original reset voltage $V_{dd}$.

Although the embodiment of FIG. 1 shows a so-called 3T (three transistor) pixel, the method is equally applicable for a pinned photodiode pixel as well. The capacitance $C_D$ of the photodiode 10 is comparable to the sense node or the floating diffusion of a pinned photodiode pixel, such as that disclosed in the U.S. patent publication 2005/0051701 for a "Image Sensor Having Pinned Floating Diffusion Diode," the disclosure of which is incorporated by reference for all purposes permitted by law and regulation. The term "floating diffusion associated with a photodiode" as used in this specification and its claims therefore will be understood to refer to both the capacitance inherently associated with photodiodes such as the photodiode 10 shown in FIG. 1 and the sense node or a floating diffusion of pinned photodiode pixels, depending on which type of pixel is employed.

The pixel 1 also comprises a transfer transistor 12 and a latch 14. The transistor 12 behaves more like a charge sharing gate, as will be discussed further below.

The photodiode 10 has a small inherent capacitance $C_D$. By itself, the photodiode 10 will provide high initial gain. In the high gain mode, the signal voltage TSR is held low through the latch 14. As will be discussed below, the latch 14 provides individual gain adaptation on a pixel-by-pixel basis.

Light preferably is coupled to the photodiode 10 through a micro-lens or via back-illumination in order to provide high effective fill-factor. A disclosure of back illumination in CMOS or CCD images is provided in the present inventor's pending U.S. non-provisional application Ser. No. 11/226,902 for "Method for Implementation of Back-Illuminated CMOS or CCD Imagers," published as US 2006/0068586, the disclosure of which is incorporated by reference into this specification for all purposes permitted by law and regulation. This will permit the pixel 1 to operate simultaneously with high gain and high quantum efficiency (a measure of the sensitivity of the pixel 1). Maintaining high quantum efficiency is important because a loss of quantum efficiency will work against the means for dynamic range enhancement disclosed in this specification.

Once the pixel level exceeds a preset threshold, meaning in this case that the electron charge level stored in the internal capacitance $C_D$ of the photodiode 10 reduces the output voltage of the photodiode 10 below a preselected level $V_{Ref}$ (see FIG. 3), the signal voltage TSR is turned on as explained below and activates the gate 12 through the latch 14. This will add additional capacitance $C_L$ from a capacitor 16 in parallel to the capacitance $C_D$ of the the photodiode 10, thereby reducing the electron to voltage conversion gain of the photodiode 10 and increasing the electron handling capacity of the pixel 1.

Thus, the pixel 1 provides high-gain with low-noise at low light levels, and low-gain with high-charge-handling-capacity at high light levels, thereby providing a high dynamic range with low noise and high linearity.

FIG. 1 also shows that the pixel 1 is sampled four times at the bottom of the column 20, using four sampling capacitors 22, 24, 26, and 28 for offset error elimination as described below instead of the conventional two sampling capacitors. The transition point from high gain to low gain is determined by the output of the column comparator 40.

Figure 2:
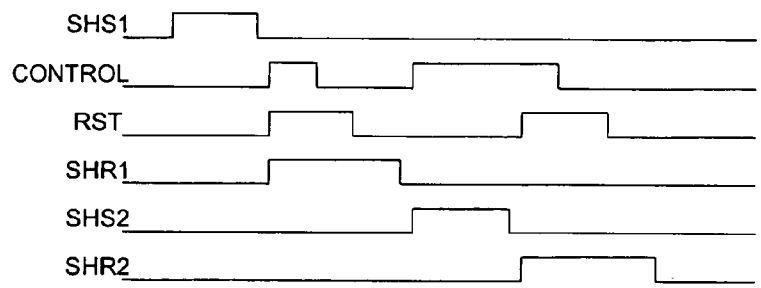
FIG. 2 shows a timing diagram for the high-dynamic range pixel circuit of FIG. 1.

FIG. 2 shows the timing diagram of the operation of the pixel 1. At the end of the integration, the pixel value is sampled at the bottom of the column 20 by pulsing SHS1 (sampling capacitor 22) momentarily high. The circuitry for pulsing or turning on the various capacitors and transistors is not shown in the drawings but will be known to those of skill in the art. Depending upon the illumination flux level, the output of latch 14 (CONTROL) may or may not be high when this first sample is taken. (The latch output happens not to be high at this point in the timing diagram shown in FIG. 2.) Following the sampling of the pixel value at the end of the exposure or integration time, various references are sampled. First, the high gain reset level is sampled by pulsing the latch output, RST, and SHR1 (sampling capacitor 26) high. The latch output is returned to low before RST and SHR1 in order to ensure that the sampled value corresponds to the high gain reset (or for reset $C_D$ only). The difference between the levels sampled at the capacitors 22 and 26 is $V_{out(1)}$.

Assuming that the pixel 1 was not switched into the low gain mode during the integration period, the final output of the pixel 1 is $V_{out}=V_{out(1)}$. No further measurement is needed to generate the image output.

If the pixel 1 was switched into the low gain mode during the integration period, the latch 14 output will have been set high. The latch output value during integration will be stored on or off chip for determining wheter the pixel 1 was switched into the low gain mode. An offset correction will be applied assuming that the pixel 1 was switched into the low gain mode.

The offset introduced by switching from high gain to low gain mode—that is, when the signal voltage TSR is pulsed high—is measured next by pulsing only the signal voltage TSR high and sampling the resultant signal by pulsing SHS2 (sampling capacitor 24). The final sample corresponds to the high gain reset again, and is sampled by pulsing SHR2 (sampling capacitor 28) at the appropriate time and setting. The difference of the levels at capacitors 24 and 28 is $V_{out(2)}$. When the pixel is operated in the low gain mode, the final output of the imager is $V_{out}=V_{out(1)}-V_{out(2)}$ and corresponds to the offset corrected output from the pixel.

It is also possible to omit the sampling capacitor 28 and use the value sampled when SHR1 is pulsed (sampling capacitor 26) as the reference for both determining $V_{out(1)}$ and the gain-switching offset measurement. The actual operation is schematically explained below.

Figure 3:
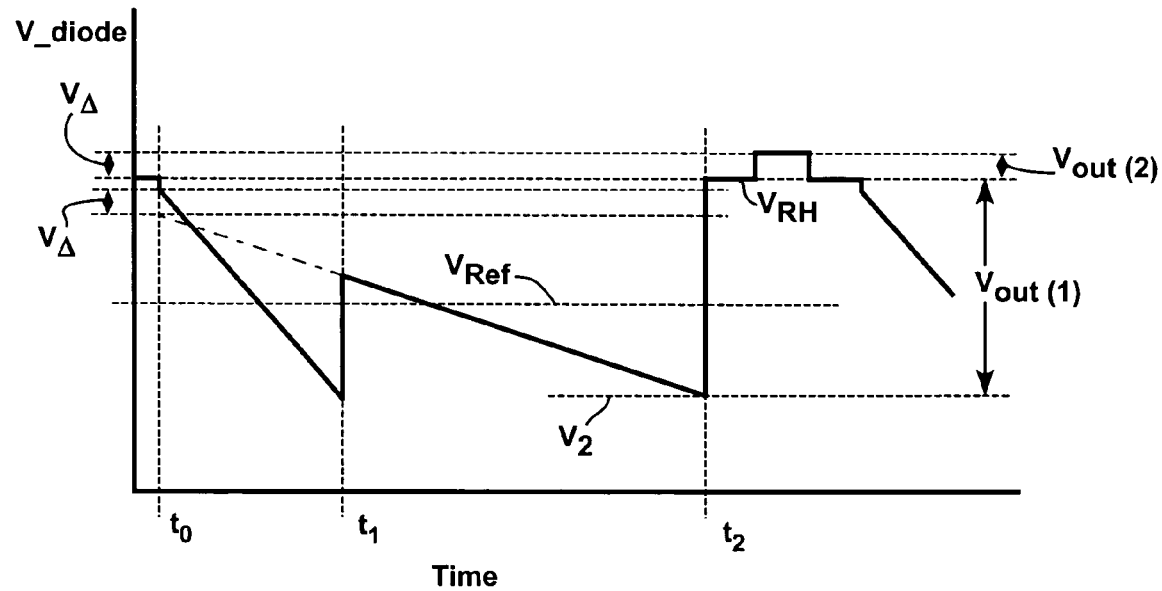
FIG. 3 shows graph of the voltage with respect to time of the high-dynamic range pixel circuit of FIG. 1.

FIG. 3 shows the voltage excursions of the photodiode 10. The exposure of the diode 1 begins at time $t=t_0$. This is the start of the integration time. The pixel 1 is accessed at $t=t_1$ by momentarily pulsing SEL, but is not sampled. At this point, the comparator 40 is strobed to compare the pixel output against a reference voltage $V_{Ref}$. If the pixel output is below the reference voltage, then the signal voltage TSR is turned on, the latch output is set high, and the pixel 1 is set to a low-gain mode, as shown in FIG. 3.

Since most of the time in an imager is spent in getting the data out, while row sampling can be carried out in a short time (~few μsec), the pixel 1 can be accessed and compared to a reference voltage multiple times for best gain adaptation.

The pixel 1 is then readout at $t=t_2$. In this case, the pixel output at $t=t_2$ is given by:

$$V_2 = V_{RH} - g(x)\Phi(t_2-t_0) - V_\Delta(x) \tag{3}$$

where $V_2$ is the pixel output, $V_{RH}$ is the reset level with TSR high, $V_\Delta(x)$ is the offset introduced by switching from high to low gain, $\Phi$ is the illumination flux, $g(x)$ is the pixel gain for x=high or low setting, and $t_2-t_0$ is the exposure time. If the pixel output falls below the reference level $V_{Ref}$, x=low, otherwise x=high. Under these conditions, the gain and offsets are given by (with reference to FIG. 1):

$$g(\text{high}) = \frac{\eta}{C_D}; \tag{4}$$

$$g(\text{low}) = \frac{\eta}{C_D+C_L};$$

$$V_\Delta = \frac{\Delta q_{sw} + C_L(V_{RH}-V_{RL})}{C_D+C_L}$$

where $\eta$ is the quantum efficiency, $C_D$ is the small diode capacitance, $C_L$ is the large linear capacitance that is added when the comparator 40 triggers, $\Delta q_{sw}$ is the amount of switch-feedthrough charge (shown in FIG. 3 as the small step down of the diode voltage at $t_0$), $V_{RH}$ is the reset voltage for $C_D$-only reset, and $V_{RL}$ is the reset voltage corresponding to $C_L$ and $C_D$ reset. $V_\Delta$ is zero if the gain switching does not occur. FIG. 3 shows a situation in which gain switching did occur and therefore $V_\Delta$ is not zero.

Any measurement system involving gain switching suffers from transition point uncertainty error and offset error. The former will introduce significant calibration error, and the latter will introduce fixed pattern noise in an imager.

In a typical measurement system where the gain is switched from high to low at some input signal level, the transfer function is described as:

$$V_{out} = V_{knee} + G_L(V_{in}-V_{knee}) \text{ for } V_{in} > V_{knee} \tag{5}$$

$$= G_H V_{in} \text{ for } V_{in} < V_{knee}$$

in which $V_{knee}$ refers to the voltage following the switch in gain.

Any uncertainty in $V_{knee}$ directly translates into calibration point error, resulting in a discontinuity in the transfer function, and loss of absolute photometric accuracy around the transition point. The problem will be particularly severe if this approach is used in an imager pixel. In that case, every pixel will have a different "knee-point" which will be next to impossible to calibrate. As a result, such an imager will suffer from non-linearity and fixed pattern noise errors around the gain transition point. One of the most noticeable effects of this non-linearity and discontinuity problem occurs in a color imager in form of color artifacts, since the color is reconstructed by combining outputs of multiple pixels.

In the approach described in this specification, the "knee-point" uncertainty problem is completely eliminated due to charge sharing when the gain is switched from high to low by activating the latch 14 output. As a result of charge sharing between $C_L$ and $C_D$ once the latch output is high, the effective gain for the entire exposure duration is given by a single gain value g(low), and irrespective of the signal level where the gain switching occurred, thereby eliminating the need for accurately knowing "knee-point" level. Thus, as shown in equation (3), the two gain values, g(high) and g(low), completely describe the transfer characteristics of the pixel, without any needing any information of the knee-point level, where the gain was switched. In other words, different pixels will be switching from high to low gain at slightly different input levels due to intrinsic threshold variations, but the switching happens in such a manner that the output is independent of the intrinsic "knee-points." Only the knowledge of g(high) and g(low) and whether the latch has been set high during integration are needed, but no information about $V_{knee}$ is required, as shown in equation (3). Therefore, the transition point error is completely eliminated in the approach described in this specification.

It is also important to note that the error in the reference level (the comparison level) does not cause any calibration errors, although it may affect the range of gain adaptation. If the transition point from high gain to low gain shifts as a result of comparator offset, it may impair the choice of best gain values, but it does not affect the absolute calibration, and the output is still given by the equation (3), irrespective of the threshold of the comparator 40, as long as it is known which gain setting was used in which time slot. In order to improve gain-adaptation efficiency, each pixel 1 could be compared more than two times with appropriately scaled thresholds. Another transition point can be found soon enough if a transition point is missed due to comparator threshold errors.

In general when gain is switched in a measurement system, it also introduces an offset error. The offset is present in the approach described in this specification as well. However, this error can be exactly calibrated out without introducing any non-linearity. As shown in equation (4), the offset in the output level between the two gain levels is given by $V_A$, which depends on the switch-feedthrough, and respective reset levels of $C_D$ and $C_L$, but not on the accumulated signal. Since $V_A$ is independent of the accumulated signal, it can be accurately calibrated out without introducing any non-linearity.

In order to estimate and eliminate $V_A$ when the gain has been switched or changed, an additional pair of capacitors at the bottom of the column 20 is used to differentially sample $V_A$. In a typical imager, two capacitors are used at the bottom of the column to differentially sample the reset level ($V_{RH}$) and the signal level ($V_2$) to provide an output $V_{out(1)} = V_{RH} - V_2$. In the approach described in this specification, as shown in FIG. 1, an extra pair of sampling capacitors 24 and 28 is used to estimate $V_A$. As shown in equation (4), $V_A$ is the difference in the pixel output with and without the signal voltage TSR ON.

As shown in FIG. 3, the pixel output immediately after reset without the latch output being high or ON is the reset level in the high gain mode ($V_{RH}$). If the latch is turned on after this, the output level changes to a different value, determined by the reset level in the high and low gain mode ($V_{RH}$ and $V_{RL}$ respectively), as shown in FIG. 3. $V_A$ is the difference between these two levels. As indicated by the timing diagram in FIG. 2, the sampling capacitors 24 and 28 sample the output levels in the high and low gain mode (latch 14 output OFF and ON) immediately after the pixel 1 is reset in high gain mode. The resultant difference between the signals sampled by the capacitors is then $V_{out(2)} = V_A$. Thus, one pair of capacitors is provided for measuring the signal differentially with respect to high-gain reset, and the other pair of sampling capacitors for measuring $V_A$. The final output in the case when the gain has beed switched or changed during integration is $V_{out} = V_{out(1)} - V_{out(2)} = V_{RH} - V_2 - V_A = g(x)\Phi(t_2 - t_0)$ (from equation (3)), that depends only on the incoming signal, and is independent of the offset, thereby eliminating pixel-to-pixel offset and allowing imager operation with extremely low fixed-pattern-noise. As mentioned earlier, the offset correction is carried out only if the pixel is switched into the low-gain state. There is no need to carry out the offset correction, if the gain is not switched.

Figure 4:
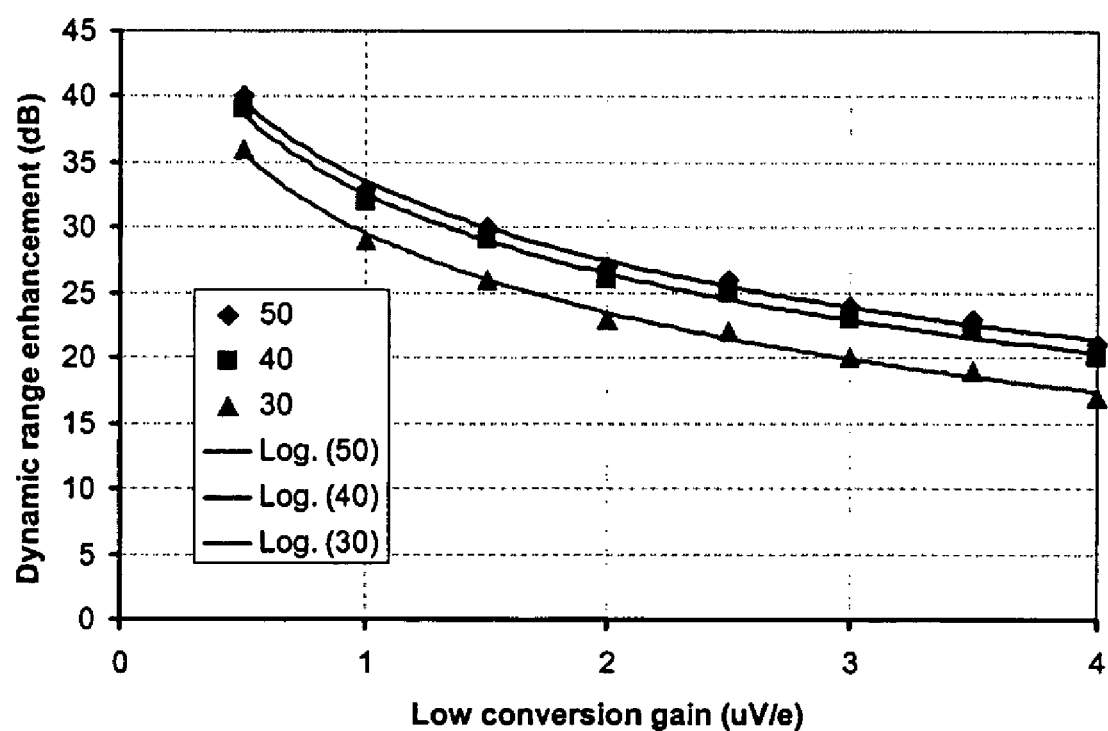
FIG. 4 shows a graph of the modelled dynamic range enhancement of the high-dynamic range pixel circuit of FIG. 1.

For a given maximum output voltage swing, the increase in dynamic range depends on the noise floor and the gain ratios only. Assuming a downstream noise of 100 µV, and kTC noise limited operation, a substantial increase in dynamic range can be obtained if proper values of the conversion gains are chosen. FIG. 4 shows the modeled dynamic range enhancement as a function of the low conversion gain with the high conversion gain as a parameter. It indicates that as much as 40 dB increase in dynamic range is possible using this approach, while at the minimum an approximately 20 dB increase is obtained. Finally, since the imager operates with only two well-defined conversion gains, it is easy to accurately measure both these gains using conventional and well-trusted techniques, allowing excellent imager calibration at all illumination levels.

Back-illumination allows integration of circuits alongside the photodetector without sacrificing optical fill-factor. This approach allows integration of the latch circuit in the pixel for controlling the high or the low gain state. For selecting the low gain state, the output of the latch 14 is high, and the gate 12 is turned on, and the pixel capacitance is the sum of $C_L$ and $C_D$. Alternately, the output of the latch 14 is low and the gate 12 is turned off, and the pixel capacitance is only $C_D$.

High resolution imaging requires a reduction in the pixel pitch. In turn, it requires a compact latch circuit implementation. A typical digital latch consists of a pair of cross-coupled inverter gates, requiring more than five FETs for implementation. This circuit is too big to integrate in a high resolution pixel. Additional FETs will be needed to select the latch on a pixel-by-pixel basis, further complicating the implementation.

In addition, there is another problem. A standard latch requires at least two p-channel FETs. In a bulk-CMOS process, a p-channel FET resides inside an n-well area, the n-well being biased to a high voltage, e.g., $V_{dd}$. This is a problem in a back-illuminated pixel implementation, since the n-well biased to a high voltage will collect photoelectrons that are meant to be collected by the photodiode. As a result, the presence of n-well will result in vastly reduced photo-sensitivity of the pixel, which is obviously not desirable.

Figure 5:
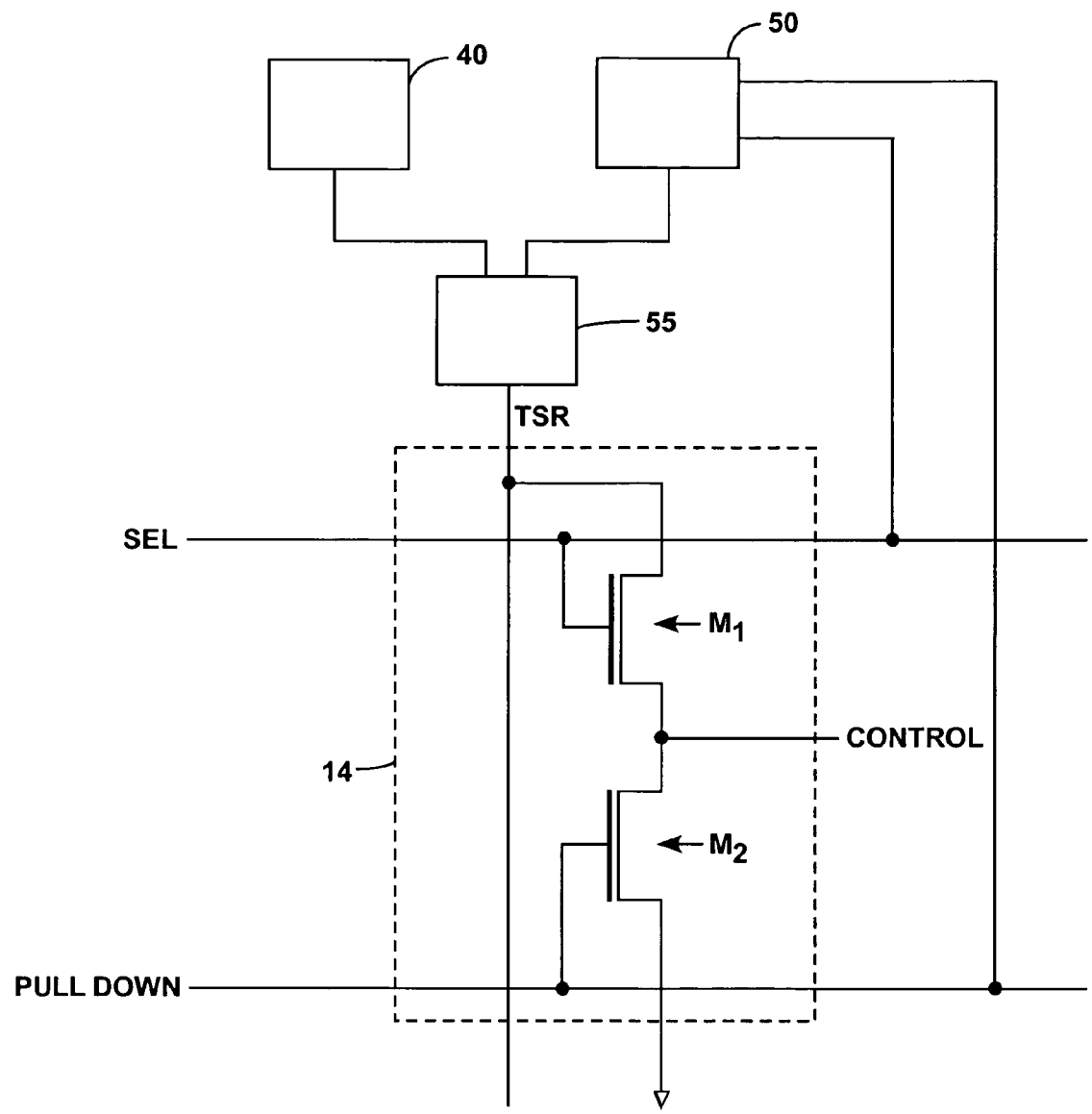
FIG. 5 shows a schematic of a preferred embodiment of a latch circuit for use in the high-dynamic range pixel circuit.

A solution to this problem is to use a currently preferred embodiment of a compact latch circuit 14 that takes advantage of the imager timing and an innovative circuit design shown in FIG. 5. This compact latch circuit 14 requires only two FETs, both of which of n-channel type. Elimination of p-FETs from the implementation of compact latch circuit 14 eliminates the need for inclusion of additional n-wells in the pixel 1, and therefore protects against sensitivity loss.

The compact latch circuit 14 is shown in FIG. 5. It consists of two n-channel FETs M1 and M2. The drain of M1 is connected to TSR, a logic signal that runs in the column direction. Its gate is connected to the row-decoded signal SEL. The gate of M2 is connected to another row-decoded signal PULL DOWN. The output CONTROL of the compact latch circuit 14 determines whether the FET 12 in FIG. 1 is ON or OFF.

The compact latch circuit 14 operates synchronously with the pixel 1, in a row-by-row fashion. In other words, the compact latch circuit 14 can be activated or deactivated only during a given row phase of the imager.

The first step in the operation is to reset the compact latch circuit 14 to a low state. This is done by momentarily pulsing the PULL DOWN signal so that the output of the compact latch circuit 14—CONTROL—is returned low. If the comparator 40 is triggered (indicating the need for switching the pixel conversion gain) or if the controller 50 requires the compact latch circuit 14 to be set to high, TSR is turned high. As shown in FIG. 5, TSR is connected to the output of the column-wise comparator 40 or the on-chip controller circuit 50 by a switch 55.

As mentioned above, the compact latch circuit 14 resides in the pixel 1. Therefore, the latch operation consists of actions—first to select one latch in the entire N×N array, and then to set it. The 2-FET compact latch circuit 14 shown in FIG. 5 and described above carries out both these tasks. To set the compact latch circuit 14, current must flow in M1 causing the already discharged output to go high, setting the compact latch circuit 14. Once set, the compact latch circuit 14 is not cleared until M2 is turned on again by pulsing the PULL DOWN signal. Thus, if PULL DOWN is not pulsed, a set latch 14 will not clear by itself.

To pass current through transistor M1, both SEL and TSR need to be high. Since TSR is a column-based logic signal, and SEL is a row-based logic signal, this process selects only one compact latch circuit 14 and sets the output (CONTROL) high. For a column in which TSR is high, but SEL is low, the compact latch circuit 14 is not activated, and the output of the compact latch circuit 14 does not change. Similarly, for a row in which SEL is high, but the column TSR is low, the compact latch circuit 14 is not activated either. Only when both TSR and SEL are high (which happens for only one pixel 1), will the compact latch circuit 14 be set.

Therefore, the compact two-FET latch circuit 14 described operates in a synchronous fashion. It is first preset to a low state, and then is selectively set by appropriately pulsing TSR and SEL to set the output of the compact latch circuit 14 high or low, and thereby control the conversion gain of the pixel 1.

While illustrative embodiments of the circuits and methods disclosed herein have been shown and described in the above description, numerous variations and alternative embodiments will occur to those skilled in the art and it should be understood that, within the scope of the appended claims, the invention may be practised otherwise than as specifically described. Such variations and alternative embodiments are contemplated, and can be made, without departing from the scope of the invention as defined in the appended claims.

What is claimed is:

1. An imager circuit having increased dynamic range comprising:
   a plurality of pixels, each pixel comprising:
   a. a floating diffusion associated with a photodiode;
   b. at least one capacitor; and
   c. a device for selectively coupling the at least one capacitor to the floating diffusion so as to increase capacitance available to the pixel and thereby decrease the gain of the pixel, the
   imager circuit further comprising a comparator to determine when a pixel accumulation voltage reaches a preset value and connected to the device for causing the device to couple the at least one capacitor to the floating diffusion when the pixel accumulation voltage reaches the preset value.

2. The imager circuit according to claim 1 further comprising control circuitry for causing the pixel accumulation voltage to be checked by the comparator at least once during an integration period to determine whether the pixel accumulation voltage has reached the preset value.

3. The imager circuit according to claim 2 in which the device comprises a transistor having a gate, a first electrode coupled to the floating diffusion, and a second electrode coupled to the at least one capacitor.

4. The imager circuit according to claim 3 wherein a latch circuit applies a voltage to the gate.

5. The imager circuit according to claim 4 in which the comparator causes the latch to apply the voltage to the gate so as to increase the capacitance available to the pixel and thereby decrease the gain of the pixel when a pixel accumulation voltage reaches a preset value during an integration period.

6. The imager circuit according to claim 5 in which the latch circuit comprises first and second n-channel field effect transistors, the source of the first n-channel field effect transistor being connected to the drain of the second n-channel field effect transistor, and a control voltage being provided from the connection between the n-channel field effect transistors to the base of the transistor of the device.

7. The imager circuit according to claim 6 in which the gate of the first n-channel field effect transistor is connected to a first row voltage, and the gate of the second n-channel field effect transistor is connected to a second row voltage, and the drain of the first n-channel field effect transistor is supplied by a column voltage, the column voltage being selectively turned high by the control circuitry or a comparator.

8. The imager circuit according to claim 4 in which the latch circuit and the transistor are incorporated into the pixel.

9. The imager circuit according to claim 1 further comprising means for correcting a transition point error introduced by a change in the gain of the pixel.

10. The imager circuit according to claim 1 further comprising means for determining and subtracting an offset error introduced by a change in the gain of the pixel.

11. The imager circuit according to claim 1 further comprising an output column connected to the floating diffusion for receiving the output voltage of the floating diffusion and a plurality of sampling capacitors connected to the output column for sampling the floating diffusion following an integration period.

12. The imager circuit according to claim 1 further comprising an output column connected to the floating diffusion for receiving the output voltage of the floating diffusion and first, second, and third sampling capacitors connected to the output column for sampling the floating diffusion following an integration period.

13. The imager circuit according to claim 12 in which the first sampling capacitor when pulsed on measures the voltage of the floating diffusion at the end of an integration period.

14. The imager circuit according to claim 13 in which the second sampling capacitor when pulsed on measures the voltage of the floating diffusion after the floating diffusion has been set to a reset voltage.

15. The imager circuit according to claim 14 in which the third sampling capacitor when pulsed on measures the voltage of the floating diffusion after the device for selectively coupling the at least one capacitor to the floating diffusion has been activated so as to increase capacitance available to the floating diffusion.

16. The imager circuit according to claim 15 further comprising a fourth sampling capacitor that when pulsed on measures the voltage of the floating diffusion after the device for selectively coupling the at least one capacitor to the floating diffusion has been deactivated so that additional capacitance is not available to the floating diffusion.

17. The imager circuit according to claim 14 further comprising means to subtract the voltage of the floating diffusion at the end of an integration period and the voltage of the floating diffusion after the floating diffusion has been set to a reset voltage to obtain $V_{out(1)}$.

18. The imager circuit according to claim 17 wherein $V_{out(1)}$ is the pixel accumulation voltage when gain of the pixel has not been lessened during the integration period.

19. The imager circuit according to claim 16 further comprising means to subtract the voltage of the floating diffusion after the device for selectively coupling the at least one capacitor to the floating diffusion has been deactivated so that additional capacitance is not available to the floating diffusion from the voltage of the floating diffusion after the device for selectively coupling the at least one capacitor to the floating diffusion has been activated so as to increase capacitance available to the floating diffusion, in order to obtain $V_{out(2)}$.

20. The imager circuit according to claim 19 further comprising means to subtract the $V_{out(2)}$ from $V_{out(1)}$ when the gain of the pixel has been lessened during the integration period in order to obtain the pixel accumulation voltage.

21. A method for utilizing each pixel of the apparatus of claim 1, the process comprising:
   a first stage which starts after said pixel has been reset and during which said pixel is being exposed to light and is accumulating;
   a second stage which occurs after an accumulation level of said pixel reaches a preset value during the integration period in which additional capacitance is coupled to the floating diffusion in order to decrease the gain of said pixel while said pixel continues to accumulate.

22. The method according to claim 21 further comprising a third stage in which an accumulation level of the photodiode is calculated free of a transition point error and an offset error.

23. A method for utilizing each pixel of the apparatus of claim 1, the method comprising:
   (a) arranging a floating diffusion associated with a photodiode in said pixel with at least three transistors in said pixel for controlling resetting of the photodiode, sensing by the photodiode, and readout of a voltage stored on the photodiode after sensing, respectively;
   (b) providing a capacitor coupled by a fourth transistor to the floating diffusion;
   (c) selectively turning on the fourth transistor in order to increase the capacitance available to the floating diffusion when the accumulation has reached a preset value.

24. The method according to claim 23 further comprising the steps of:
   providing an output column connected to the transistor for readout of a voltage stored on the floating diffusion and first and second sampling capacitors connected to the output column;
   sampling the readout voltage of the floating diffusion following an integration period by first pulsing on the first sampling capacitor in order to measure the voltage of the floating diffusion at the end of an integration period;
   sampling the readout voltage of the floating diffusion following the integration period by next pulsing on the second sampling capacitor after the floating diffusion has been set to a reset voltage; and
   subtracting the first sampled readout voltage from the second readout voltage in order to determine a $V_{out(1)}$ that is the pixel accumulation level $V_{out}$ when the capacitance available to the floating diffusion has not been increased.

25. The method according to claim 24 further comprising the steps of:
   providing a third sampling capacitor connected to the output column;
   sampling the readout voltage of the floating diffusion following the integration period by next pulsing on the third sampling capacitor after the device for selectively coupling the at least one capacitor to the floating diffusion has been activated so as to increase capacitance available to the floating diffusion;
   sampling the readout voltage of the photodiode following the integration period when the device for selectively coupling the at least one capacitor to the photodiode has been deactivated so that additional capacitance is not available to the floating diffusion; and subtracting the third sampled readout voltage from the fourth readout voltage in order to determine a $V_{out(2)}$.

26. The method according to claim 25 further comprising the step of calculating the pixel accumulation level $V_{out}$ according to the formula $V_{out}=V_{out(1)}-V_{out(2)}$ that is the pixel accumulation level $V_{out}$ when the capacitance available to the floating diffusion has been increased.

27. A method for utilizing each pixel of an imager circuit having increased dynamic range, the imager circuit comprising:
   a plurality of pixels, each pixel comprising:
   a. a floating diffusion associated with a photodiode;
   b. at least one capacitor; and
   c. a device for selectively coupling the at least one capacitor to the floating diffusion so as to increase capacitance available to the pixel and thereby decrease the gain of the pixel, the method comprising:
   a first stage which staffs after said pixel has been reset and during which said pixel is being exposed to light and is accumulating;
   a second stage which occurs after an accumulation level of said pixel reaches a preset value during the integration period in which additional capacitance is coupled to the floating diffusion in order to decrease the gain of said pixel while said pixel continues to accumulate; and
   a third stage in which an accumulation level of the photodiode is calculated free of a transition point error and an offset error.

28. A method for utilizing each pixel of an imager circuit having increased dynamic range, the imager circuit comprising:
   a plurality of pixels, each pixel comprising:
   a. a floating diffusion associated with a photodiode;
   b. at least one capacitor; and c. a device for selectively coupling the at least one capacitor to the floating diffusion so as to increase capacitance available to the pixel and thereby decrease the gain of the pixel, the method comprising:

(a) arranging a floating diffusion associated with a photodiode in said pixel with at least three transistors in said pixel for controlling resetting of the photodiode, sensing by the photodiode, and readout of a voltage stored on the photodiode after sensing, respectively;

(b) providing a capacitor coupled by a fourth transistor to the floating diffusion;

(c) selectively turning on the fourth transistor in order to increase the capacitance available to the floating diffusion when the accumulation has reached a preset value;

(d) providing an output column connected to the transistor for readout of a voltage stored on the floating diffusion and first and second sampling capacitors connected to the output column;

(e) sampling the readout voltage of the floating diffusion following an integration period by first pulsing on the first sampling capacitor in order to measure the voltage of the floating diffusion at the end of an integration period;

(f) sampling the readout voltage of the floating diffusion following the integration period by next pulsing on the second sampling capacitor after the floating diffusion has been set to a reset voltage;

(g) subtracting the first sampled readout voltage from the second readout voltage in order to determine a $V_{out(1)}$ that is the pixel accumulation level $V_{out}$ when the capacitance available to the floating diffusion has not been increased;

(h) providing a third sampling capacitor connected to the output column;

(i) sampling the readout voltage of the floating diffusion following the integration period by next pulsing on the third sampling capacitor after the device for selectively coupling the at least one capacitor to the floating diffusion has been activated so as to increase capacitance available to the floating diffusion;

(j) sampling the readout voltage of the photodiode following the integration period when the device for selectively coupling the at least one capacitor to the photodiode has been deactivated so that additional capacitance is not available to the floating diffusion; and subtracting the third sampled readout voltage from the fourth readout voltage in order to determine a $V_{out(2)}$; and (k) calculating the pixel accumulation level $V_{out}$ according to the formula $V_{out}=V_{out(1)}-V_{out(2)}$ that is the pixel accumulation level $V_{out}$ when the capacitance available to the floating diffusion has been increased.

* * * * *